United States Patent
Kamgaing

(10) Patent No.: US 12,557,211 B2
(45) Date of Patent: Feb. 17, 2026

(54) PACKAGE HAVING THICK GLASS CORE WITH HIGH ASPECT RATIO VIAS

(71) Applicant: Intel Corporation, Santa Clara, CA (US)

(72) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 949 days.

(21) Appl. No.: 17/339,434

(22) Filed: Jun. 4, 2021

(65) Prior Publication Data
US 2022/0394849 A1    Dec. 8, 2022

(51) Int. Cl.
H05K 1/03        (2006.01)
H05K 1/11        (2006.01)
H05K 3/40        (2006.01)

(52) U.S. Cl.
CPC ........... *H05K 1/0306* (2013.01); *H05K 1/116* (2013.01); *H05K 3/4038* (2013.01); *H05K 2201/09827* (2013.01)

(58) Field of Classification Search
CPC ... H01L 21/4857; H01L 21/486; H01L 23/15; H01L 23/49816; H01L 23/49822; H01L 23/49827; H05K 1/0306; H05K 1/116; H05K 2201/09827; H05K 3/0029; H05K 3/107; H05K 3/4038; H05K 3/4629
See application file for complete search history.

(56) References Cited

U.S. PATENT DOCUMENTS

| | | | |
|---|---|---|---|
| 5,644,276 A | 7/1997 | Sturzebecher | |
| 6,523,252 B1 | 2/2003 | Lipponen | |
| 2003/0137056 A1* | 7/2003 | Taniguchi | H05K 3/0044 257/E23.009 |
| 2009/0056998 A1 | 3/2009 | Booth, Jr. | |
| 2011/0147055 A1* | 6/2011 | Ma | H01L 23/49822 29/830 |
| 2011/0147059 A1* | 6/2011 | Ma | H01L 24/73 156/60 |
| 2012/0168951 A1* | 7/2012 | Kim | H01L 23/49822 174/250 |

(Continued)

OTHER PUBLICATIONS

International Search Report and Written Opinion for International Patent Application No. PCT/US2022/021496 mailed Jul. 8, 2022, 12 pgs.

(Continued)

*Primary Examiner* — Timothy J Thompson
*Assistant Examiner* — Rhadames Alonzo Miller
(74) *Attorney, Agent, or Firm* — Schwabe, Williamson & Wyatt P.C.

(57) ABSTRACT

Embodiments disclosed herein include package substrates for electronic packaging applications. In an embodiment, a package substrate comprises a first glass layer, where the first glass layer comprises a first via through the first glass layer, and the first via has an hourglass shaped cross-section. The package substrate may further comprise a second glass layer over the first glass layer, where the second glass layer comprises a second via through the second glass layer, and where the second via has the hourglass shaped cross-section. In an embodiment, the first via is electrically coupled to the second via.

12 Claims, 15 Drawing Sheets

(56) References Cited

U.S. PATENT DOCUMENTS

| | | | | |
|---|---|---|---|---|
| 2013/0069251 | A1* | 3/2013 | Kunimoto | H05K 1/112 |
| | | | | 257/784 |
| 2013/0286610 | A1 | 10/2013 | Nakagawa | |
| 2014/0102768 | A1 | 4/2014 | Shizuno | |
| 2014/0144681 | A1* | 5/2014 | Pushparaj | H01L 23/49827 |
| | | | | 428/164 |
| 2014/0175651 | A1 | 6/2014 | Pelto | |
| 2014/0251947 | A1 | 9/2014 | Hong | |
| 2015/0027757 | A1* | 1/2015 | Shin | H05K 3/107 |
| | | | | 174/255 |
| 2016/0322290 | A1* | 11/2016 | Ma | H01L 24/17 |
| 2017/0140862 | A1 | 5/2017 | Yun et al. | |
| 2019/0185373 | A1* | 6/2019 | Hu | C03C 15/00 |
| 2019/0206780 | A1 | 7/2019 | Chatterjee | |
| 2019/0274217 | A1 | 9/2019 | Zhang | |
| 2019/0355654 | A1 | 11/2019 | Xu | |
| 2020/0203266 | A1* | 6/2020 | Iwai | H01L 23/49822 |
| 2020/0354262 | A1* | 11/2020 | Guo | C03C 3/093 |
| 2021/0104475 | A1 | 4/2021 | Radhakrishnan | |
| 2023/0197618 | A1* | 6/2023 | Kamgaing | H01L 23/5383 |
| | | | | 257/700 |
| 2023/0397333 | A1* | 12/2023 | Goh | H01L 23/49822 |

OTHER PUBLICATIONS

International Preliminary Search Report for International Patent Application No. PCT/US2022/021496 mailed Dec. 14, 2023, 8 pgs.

Office Action for Taiwan Patent Application No. 111110171 mailed May 26, 2025, 9 pgs.

Office Action for U.S. Appl. No. 17/339,420 mailed Jul. 1, 2024, 13 pgs.

Final Office Action for U.S. Appl. No. 17/339,420 mailed Dec. 6, 2024, 13 pgs.

Office Action for U.S. Appl. No. 17/339,420 mailed Apr. 10, 2025, 9 pgs.

Final Office Action for U.S. Appl. No. 17/339,420 mailed Oct. 1, 2025, 10 pgs.

Notice of Allowance for Taiwan Patent Application No. 111110171 mailed Oct. 1, 2025, 3 pgs.

* cited by examiner

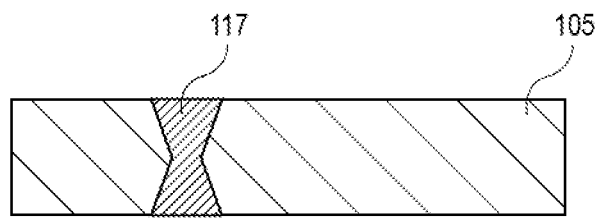
FIG. 1D
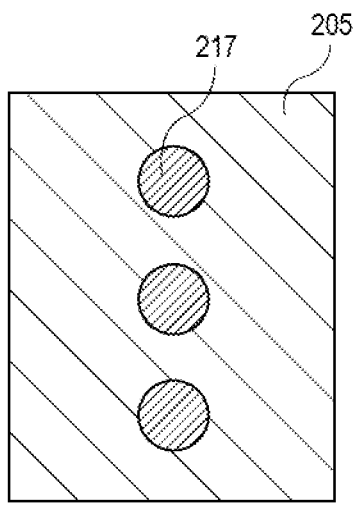 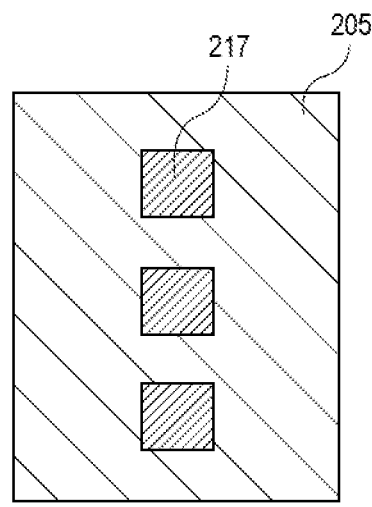
FIG. 2A  FIG. 2B

PACKAGE HAVING THICK GLASS CORE WITH HIGH ASPECT RATIO VIAS

TECHNICAL FIELD

Embodiments of the present disclosure relate to electronic packages, and more particularly to package substrates with core layers that include vias and vertical planes for improved performance.

BACKGROUND

Microelectronic packages utilize through package vias to enable power and signal connectivity between the die and socket or printed circuit board. For the most advanced packages, the package substrate stack-up comprises a core that is made out of glass-fiber reinforced epoxy or copper clad laminate (CCL). In the client and server space, using a thick core is necessary to reduce the package warpage. Creating small diameter and fine pitch vias across such thick cores is challenging. This leads to excessive parasitics, substantial impedance discontinuities and low via density in the core. This further results in low integration density, low frequency bandwidth, and low bandwidth density for signals transitioning between the first level and second level interconnects.

BRIEF DESCRIPTION OF THE DRAWINGS

FIG. 1D is a cross-sectional illustration of the glass core with a via through the thickness of the glass core, in accordance with an embodiment.

FIG. 2A is a plan view illustration of the glass core with a plurality of circular vias, in accordance with an embodiment.

FIG. 2B is a plan view illustration of the glass core with a plurality of rectangular vias, in accordance with an embodiment.

EMBODIMENTS OF THE PRESENT DISCLOSURE

Figure 1A:
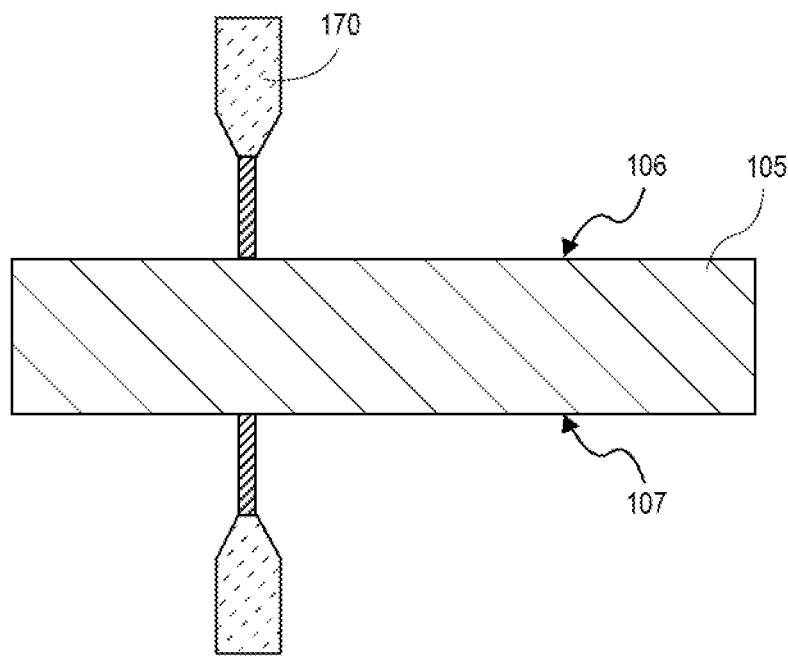
FIG. 1A is a cross-sectional illustration of a glass core with top and bottom surfaces that are being exposed with a laser, in accordance with an embodiment.

Described herein are package substrates with core layers that include vias and vertical planes for improved performance, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, existing through core vias are formed with mechanical drilling processes. This results in relatively large via diameters and pitches. This results in low integration density, low frequency bandwidth, and low bandwidth density for signals transitioning between the first level and second level interconnects. Accordingly, embodiments disclosed herein include package core substrates that are manufactured out of a material that can be patterned with a laser exposure and etching process. The laser exposure creates a morphological change in the core substrate. The morphological change can then be used to selectively etch away portions of the core substrate to form through holes. Vias may then be disposed into the holes to provide connections between opposing surfaces of the core substrate. In an embodiment, the core substrate may be glass, ceramic, silicon, or any other non-conductive semiconductor material.

The laser-assisted etching process allows for the formation of crack free, high-density via holes into the core substrate. Whereas existing through core vias have diameters of 100 µm or larger and pitches of 250 µm or larger, the laser-assisted etching process may enable via diameters that are approximately 50 µm or smaller and pitches that are approximately 40 µm or larger. The via diameters may be approximately 10 µm or smaller without a mask, or approximately 5 µm or smaller or 2 µm or smaller when a hardmask is used. The thickness of the core may also be between approximately 100 µm and 1,000 µm. Though it is to be appreciated that embodiments may also apply to larger and/or smaller via diameters, via pitches, and core substrate thicknesses.

In addition to the formation of through core vias, the laser-assisted etching process may also be harnessed to provide alternative functionalities within the core substrate. For example, materials other than conductive materials may be disposed in the via holes, or the via holes may be left voided in the final structure (e.g., to function as a fluidic pathway). Additionally, the laser exposure may be tuned to provide different structural features within the core. For example, blind vias may be formed partially through the thickness of the core substrate.

In yet another embodiment, high aspect ratio vias may be made through the core substrate using a multi-layered approach. For example, a plurality of core substrate layers may be adhered to each other in order to provide a thicker overall core. The vias may be made through each core substrate layer before adhering the layers together. As such, each portion of the overall via requires a smaller aspect ratio compared to forming a single via through a single thicker core substrate.

Referring now to FIGS. 1A-1D, a series of cross-sectional illustrations depicting a process for forming a via in a core substrate 105 using a laser-assisted etching process is shown, in accordance with an embodiment. As shown in FIG. 1A, the core substrate 105 is exposed by a laser 170. The laser 170 may be irradiated over both a first surface 106 and a second surface 107. However, as will be described in greater detail below, the laser 170 may only irradiate a single surface in of the core substrate 105 in other embodiments.

In an embodiment, the core substrate 105 may comprise a material that is capable of forming a morphological change as a result of the exposure by the laser 170. For example, in the case of a glass core substrate 105, the morphological change may result in the conversion of an amorphous crystal structure to a crystalline crystal structure. While glass is used as an example here, it is to be appreciated that the core substrate 105 may also comprise ceramic materials, silicon, or other non-conductive semiconductor materials. In an embodiment, the core substrate 105 may have a thickness between the first surface 106 and the second surface 107 that is between 200 µm and 1,000 µm. However, it is to be appreciated that larger or smaller thicknesses may also be used for the core substrate 105 in other embodiments.

Figure 1B:
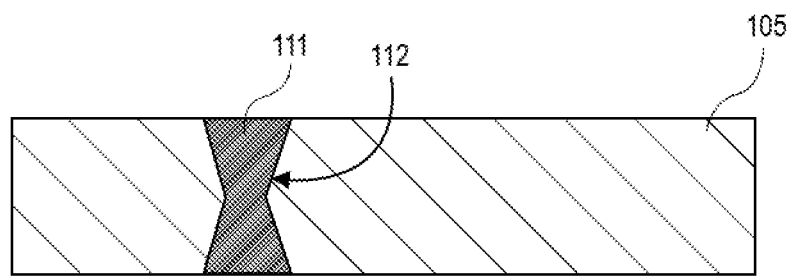
FIG. 1B is a cross-sectional illustration of the glass core with regions that have their morphology altered by the laser, in accordance with an embodiment.

Referring now to FIG. 1B, a cross-sectional illustration of the core substrate 105 after the morphological change has occurred is shown, in accordance with an embodiment. As shown, an exposed region 111 is provided through a thickness of the core substrate 105. In an embodiment, the exposed region 111 may have sidewalls 112 that are sloped. That is, the sidewalls 112 may not be substantially vertical (with respect to the first surface 106 and the second surface 107). In a particular embodiment, the exposed region 111 may have an hourglass shaped cross-section that results from exposure from laser exposure on both the first surface 106 and the second surface 107. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 112 may have a slope that is approximately 10° or less away from vertical. While shown with sloped sidewalls 112, it is also to be appreciated that embodiments may include substantially vertical sidewalls depending on the laser parameters and the material of the core substrate 105.

Figure 1C:
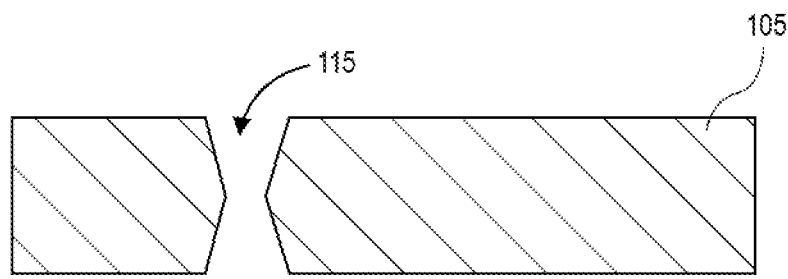
FIG. 1C is a cross-sectional illustration of the glass core with a via hole through a thickness of the glass core, in accordance with an embodiment.

Referring now to FIG. 1C, a cross-sectional illustration of the core substrate 105 after the exposed region 111 is removed to form a hole 115 through the core substrate 105 is shown, in accordance with an embodiment. In an embodiment, the hole 115 may be formed with an etching process that is selective to the exposed region 111 over the remainder of the core substrate 105. The etch selectivity of the exposed region 111 to the remainder of the core substrate 105 may be 10:1 or greater, or 50:1 or greater. That is, while selective to the exposed region 111, some portion of the core substrate 105 may also be etched, resulting in the thickness of the core substrate 105 being slightly reduced. In an embodiment, the etchant may be a wet etching chemistry.

Referring now to FIG. 1D, a cross-sectional illustration of the core substrate 105 after a via 117 is formed in the hole 115 is shown, in accordance with an embodiment. In an embodiment, the via 117 may be deposited with a plating process or any other suitable deposition process. The via 117 may be a conductive material, such as copper. A conductive via 117 may be used to provide electrical connections through the core substrate 105. However, materials that are not conductive may be deposited into the holes in order to provide structural features or to provide other functionalities. In yet another embodiment, the hole 115 may remain unfilled in order to provide features such as liquid cooling channels.

In an embodiment, the via 117 may have a maximum diameter that is approximately 100 µm or less, approximately 50 µm or less, or approximately 10 µm or less. The pitch between individual vias 117 in the core substrate 105 may be between approximately 10 µm and approximately 100 µm in some embodiments. The small diameters and pitch (compared to traditional plated through hole (PTH) vias that typically have diameters that are 100 µm or larger and pitches that are 100 µm or larger) allow for improved performance of the package substrate due, in part, to the increase in via density. Additionally, while completely filled vias 117 are described herein, it is to be appreciated that in some embodiments, the holes 115 may not be completely filled. In such embodiments, the vias 117 may be similar in structure (but smaller) than a PTH. Such vias 117 may have a non-conductive core material in some embodiments.

In FIGS. 1A-1D only a single cross-section of the core substrate 105 is shown for simplicity. However, it is to be appreciated that the shape of the vias 117 may take substantially any form. This is because the laser providing the morphological change in the core substrate 105 may be moved in a controllable manner. Examples of various plan views of a vias 217 in a core substrate 205 are shown in FIGS. 2A-2F.

Referring now to FIG. 2A, a plan view illustration of a core substrate 205 with a plurality of circular vias 217 is shown, in accordance with an embodiment. The individual circular vias 217 may be arranged in any pattern to provide desired routing or the like through the core substrate 205.

Referring now to FIG. 2B, a plan view illustration of a core substrate 205 with a plurality of rectangular vias 217 is shown, in accordance with an embodiment. As shown, the rectangular vias 217 may have widths and lengths that are substantially equal to each other. For example, the rectangular vias 217 may be substantially square in shape. In other embodiments, the rectangular vias 217 may have a width that is different than the length.

Figure 2C:
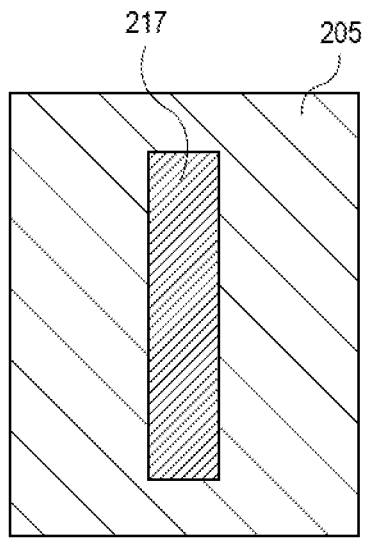
FIG. 2C is a plan view illustration of the glass core with a via plane that is rectangular, in accordance with an embodiment.

Referring now to FIG. 2C, a plan view illustration of a core substrate 205 with a via 217 that is extended along one direction is shown, in accordance with an embodiment. Such a via 217 may be referred to herein as a "via plane" or simply a "plane". The via plane 217 may have a thickness through the core substrate 205 that is substantially uniform, while also being extended in a direction, as opposed to having a width and length that are substantially uniform.

Figure 2D:
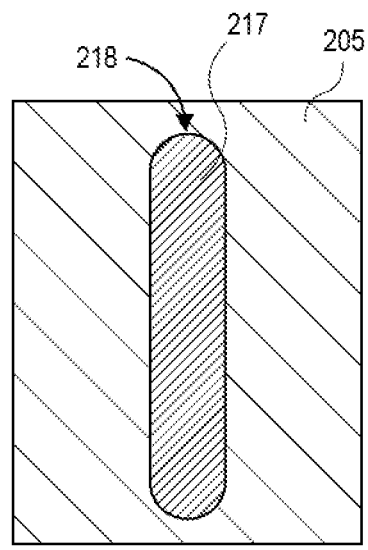
FIG. 2D is a plan view illustration of the glass core with a via plane that is rectangular with rounded edges, in accordance with an embodiment.

Referring now to FIG. 2D, a plan view illustration of a core substrate 205 with a via 217 that is extended along one direction is shown, in accordance with an additional embodiment. Similar to the embodiment shown in FIG. 2C, the via 217 forms a plane. However, the ends of the via 217 may be rounded surfaces 218. The rounded surfaces may be the result of the shape of the laser irradiation. That is, the focus of the laser may be substantially circular in some embodiments.

Figure 2E:
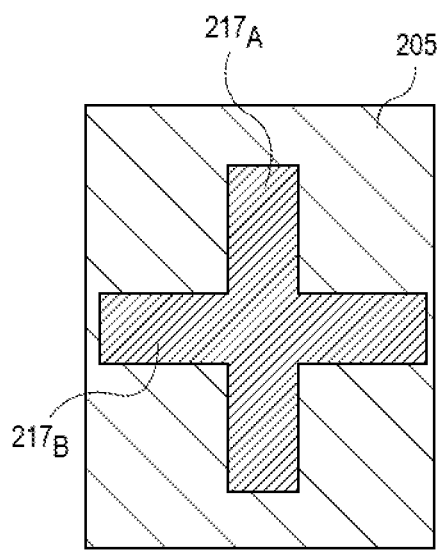
FIG. 2E is a plan view illustration of the glass core with intersecting via planes, in accordance with an embodiment.

Referring now to FIG. 2E, a plan view illustration of a core substrate 205 with a pair of vias 217A and 217B is shown, in accordance with an embodiment. As shown, the vias $217_A$ and $217_B$ may be extended to form a pair of planes through the core substrate 205. In an embodiment, the vias $217_A$ and $217_B$ may be oriented so that they intersect each other. In an embodiment, the via $217_A$ may be substantially orthogonal to the via $217_B$.

Figure 2F:
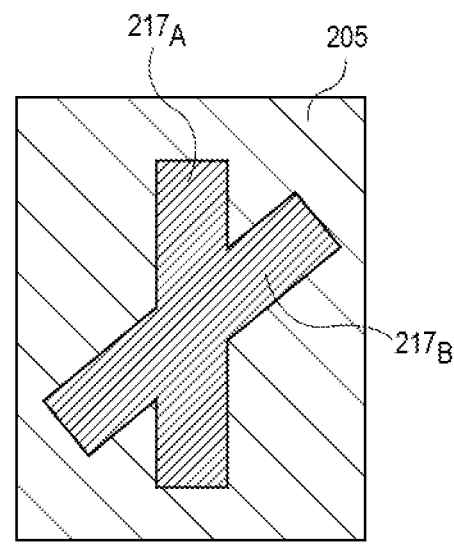
FIG. 2F is a plan view illustration of the glass core with intersecting via planes at a non-orthogonal angle, in accordance with an embodiment.

Referring now to FIG. 2F, a plan view illustration of a core substrate 205 with a pair of vias $217_A$ and $217_B$ is shown, in accordance with an additional embodiment. In an embodiment, FIG. 2F may be substantially similar to the core substrate 205 in FIG. 2E, with the exception of the via $217_A$ and the via $217_B$ intersecting at a non-orthogonal angle. Particularly, the via $217_A$ may be oriented to the via 217 at any angle between parallel and orthogonal.

Figure 3A:
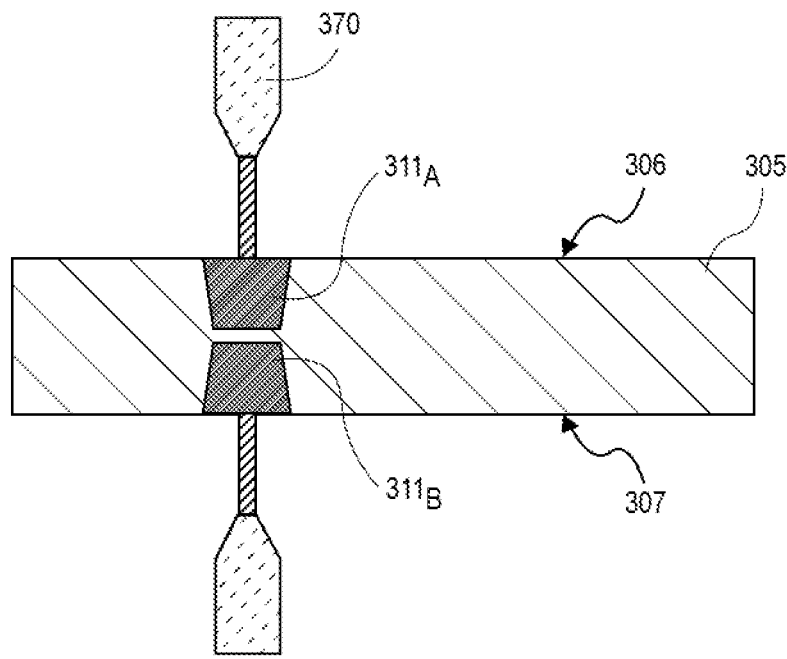
FIG. 3A is a cross-sectional illustration of a glass core with a first surface and a second surface that are exposed by a laser, in accordance with an embodiment.
Figure 3B:
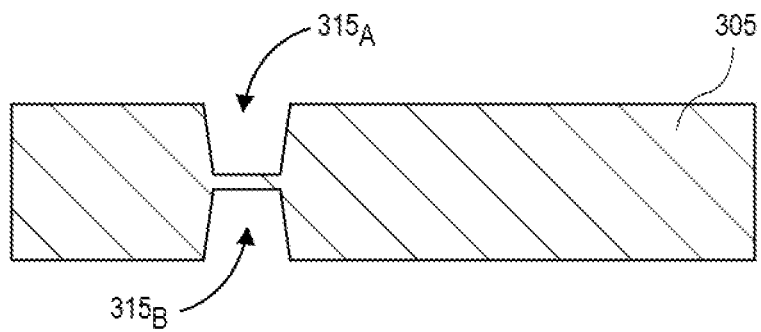
FIG. 3B is a cross-sectional illustration of the glass core with blind via openings into the first surface and the second surface, in accordance with an embodiment.
Figure 3C:
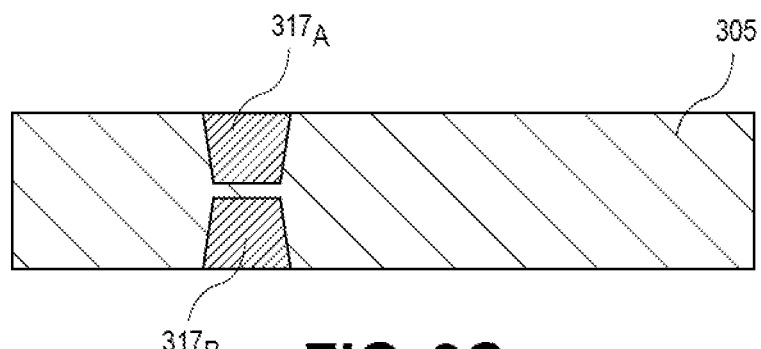
FIG. 3C is a cross-sectional illustration of the glass core with blind vias into the first surface and the second surface, in accordance with an embodiment.

The laser-assisted etching process for patterning the core substrate may also be used to fabricate features that are not through core vias. For example, a method for forming a pair of blind vias is shown in FIGS. 3A-3C. As used herein, a blind via may refer to a hole or trench that opens at a first surface of the core substrate, but does not pass entirely through a thickness of the core substrate. In the embodiment illustrated in FIGS. 3A-3C, the blind vias are substantially aligned with each other. However, it is to be appreciated that embodiments may also comprise offset blind vias.

Referring now to FIG. 3A, a cross-sectional illustration of a core substrate 305 is shown, in accordance with an embodiment. In an embodiment, the core substrate 305 may comprise a material that undergoes a morphological change when exposed to a laser. For example, the core substrate 305 may comprise glass or the like. As shown in FIG. 3A, a laser 370 is used to expose a first surface 306 and a second surface 307 of the core substrate 305. The laser exposure results in morphological changes occurring in the exposed regions $311_A$ and $311_B$. Unlike the embodiments described above, the exposed regions $311_A$ and $311_B$ do not merge together. That is, an unmodified portion of the core substrate 305 remains between the exposed regions $311_A$ and $311_B$.

Referring now to FIG. 3B, a cross-sectional illustration of the core substrate 305 after an etching process is shown, in accordance with an embodiment. As shown, the etching process results in the removal of the exposed regions $311_A$ and $311_B$ to form holes $315_A$ and $315_B$. The etching process may utilize an etching chemistry that selectively removes the exposed regions $311_A$ and $311_B$ over the unmodified regions of the core substrate 305. The etching process may be a wet etching process in some embodiments.

Referring now to FIG. 3C, a cross-sectional illustration of the core substrate 305 after vias $317_A$ and $317_B$ are disposed in the holes $315_A$ and $315_B$ is shown, in accordance with an embodiment. The vias $317_A$ and $317_B$ may comprise any material composition that can be deposited into the holes $315_A$ and $315_B$. In a particular embodiment, the vias $317_A$ and $317_B$ comprise conductive material, such as copper.

As shown, in FIG. 3C, the vias $317_A$ and $317_B$ are blind vias. That is, they do not pass through an entire thickness of the core substrate 305. Additionally, the vias $317_A$ and $317_B$ are aligned with each other so that a centerline of the via $317_A$ is substantially coincident with a centerline of the via 317$_B$. However, it is to be appreciated that in other embodiments, the vias 317$_A$ and 317$_B$ may not be aligned with each other.

Figure 4A:
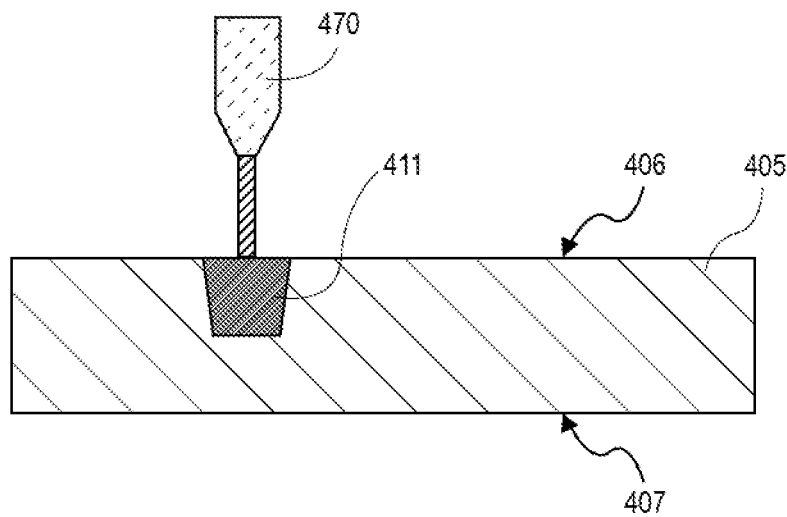
FIG. 4A is a cross-sectional illustration of a glass core with a first surface that is exposed by a laser, in accordance with an embodiment.
Figure 4B:
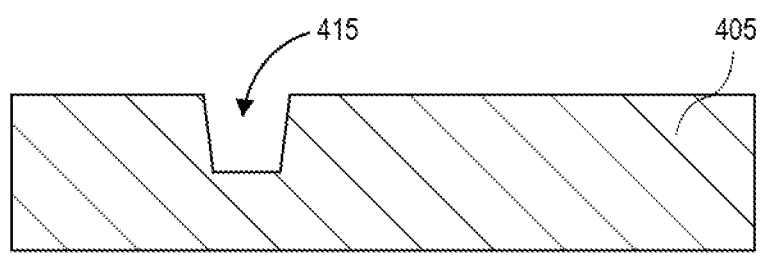
FIG. 4B is a cross-sectional illustration of the glass core with a blind via hole into the first surface, in accordance with an embodiment.
Figure 4C:
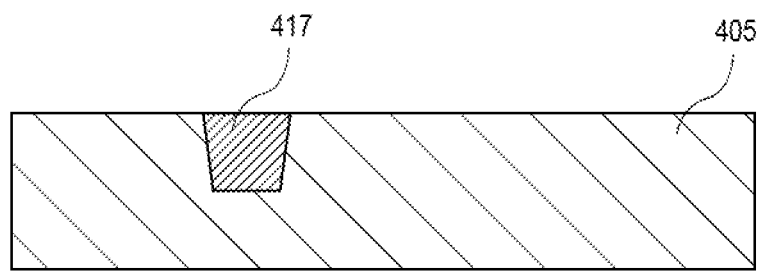
FIG. 4C is a cross-sectional illustration of the glass core with a blind via into the first surface, in accordance with an embodiment.

Referring now to FIGS. 4A-4C, a series of cross-sectional illustrations depicting a process for forming a blind via on a single surface of the core substrate is shown, in accordance with an embodiment. In contrast to the embodiments above where the laser is exposed to both surfaces of the core substrate, the embodiment shown in FIGS. 4A-4C includes exposing only a single surface of the core substrate.

Referring now to FIG. 4A, a cross-sectional illustration of a core substrate 405 is shown, in accordance with an embodiment. The core substrate 405 may comprise a material that is morphologically changed by exposure from a laser 470, such as glass. As shown, the laser 470 exposes the first surface 406 of the core substrate 405 to form an exposed region 411. In the case of glass, the exposed region may include a morphological change that includes a change from an amorphous crystal structure to a crystalline crystal structure. In some embodiments, the second surface 407 of the core substrate 405 may not be exposed to the laser 470.

Referring now to FIG. 4B, a cross-sectional illustration of the core substrate 405 after the exposed region 411 is removed with an etching process is shown, in accordance with an embodiment. In an embodiment, the etching process includes a wet etching process that selectively removes the exposed region 411 over the unexposed portions of the core substrate 405. In an embodiment a blind hole 415 is provided into, but not through the core substrate 405.

Referring now to FIG. 4C, a cross-sectional illustration of the core substrate 405 after a via 417 is disposed in the hole 415 is shown, in accordance with an embodiment. In an embodiment, the via 417 may be a conductive material, such as copper or the like. In other embodiments, the hole 415 may be filled with a nonconductive via 417 to provide different structural features in the core substrate 405.

Figure 5A:
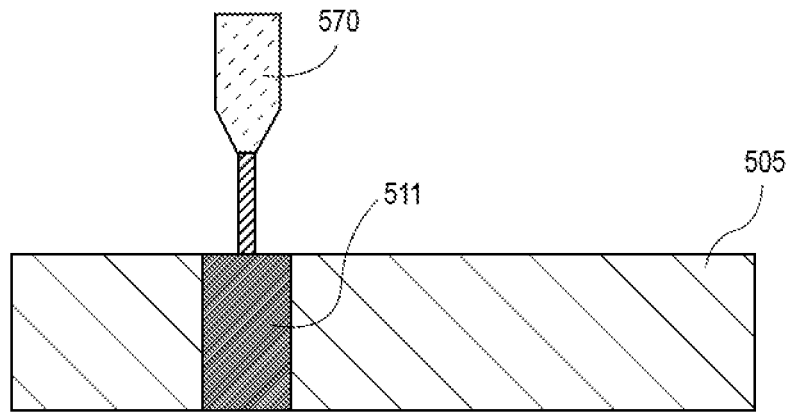
FIG. 5A is a cross-sectional illustration of a glass core with a first surface that is exposed by a laser where the morphological change in the glass core extends through an entire thickness of the glass core, in accordance with an embodiment.
Figure 5B:
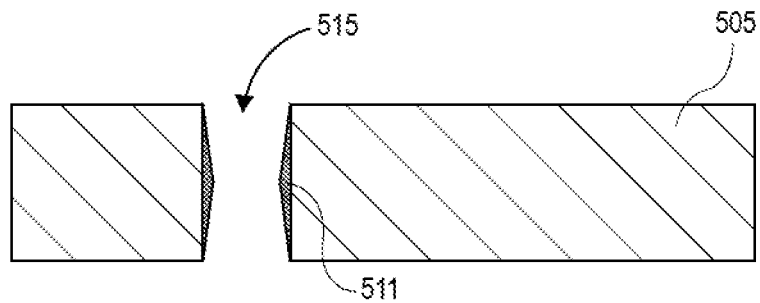
FIG. 5B is a cross-sectional illustration of the glass core with a via opening extending through the entire thickness of the glass core, in accordance with an embodiment.
Figure 5C:
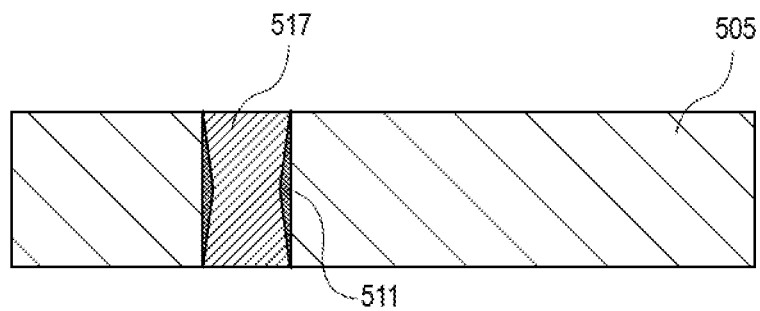
FIG. 5C is a cross-sectional illustration of the glass core with a via extending through the entire thickness of the glass core, in accordance with an embodiment.

Additional embodiments may also include the forming a through core via by exposing only a single side of the core substrate. A process for forming such a through core via is shown in FIGS. 5A-5C. As shown in FIG. 5A, a laser 570 is used to expose a portion 511 of the core substrate 505. The laser parameters may be adjusted in order to make a morphological change through the entire thickness of the core substrate 505.

Referring now to FIG. 5B, a cross-sectional illustration of the core substrate 505 after the exposed region 511 is etched away to form a through hole 515 is shown, in accordance with an embodiment. As shown, the through hole 515 may have tapered sidewalls to form an hourglass shape. The hourglass shape may be the result of the wet etching process. Particularly, since the wet etching chemistry contacts both surfaces of the core substrate 505, the width of the via hole 515 decreases toward the center of the core substrate 505. As shown, the etching process may not entirely clear the exposed region 511, and remnants of the exposed region 511 may be provided along the sidewalls of the hole 515.

Referring now to FIG. 5C, a cross-sectional illustration of the core substrate 505 after a via 517 is disposed in the hole 515 is shown, in accordance with an embodiment. In an embodiment, the via 517 may be a conductive material, such as copper. Alternative embodiments may include a via 517 that comprises a nonconductive material in order to provide alternative structures within the core substrate 505.

While several examples of laser-assisted patterning are provided above, it is to be appreciated that embodiments are not limited to structures fabricated with such processes. For example, vias, blind vias, trenches, and the like may also be formed with a lithographic process. For example, a photo-definable glass may be used as the core substrate. In such embodiments, the photo-definable glass may be exposed to actinic radiation that provides a chemical change in the glass that leaves the exposed regions susceptible to an etchant.

Figure 6A:
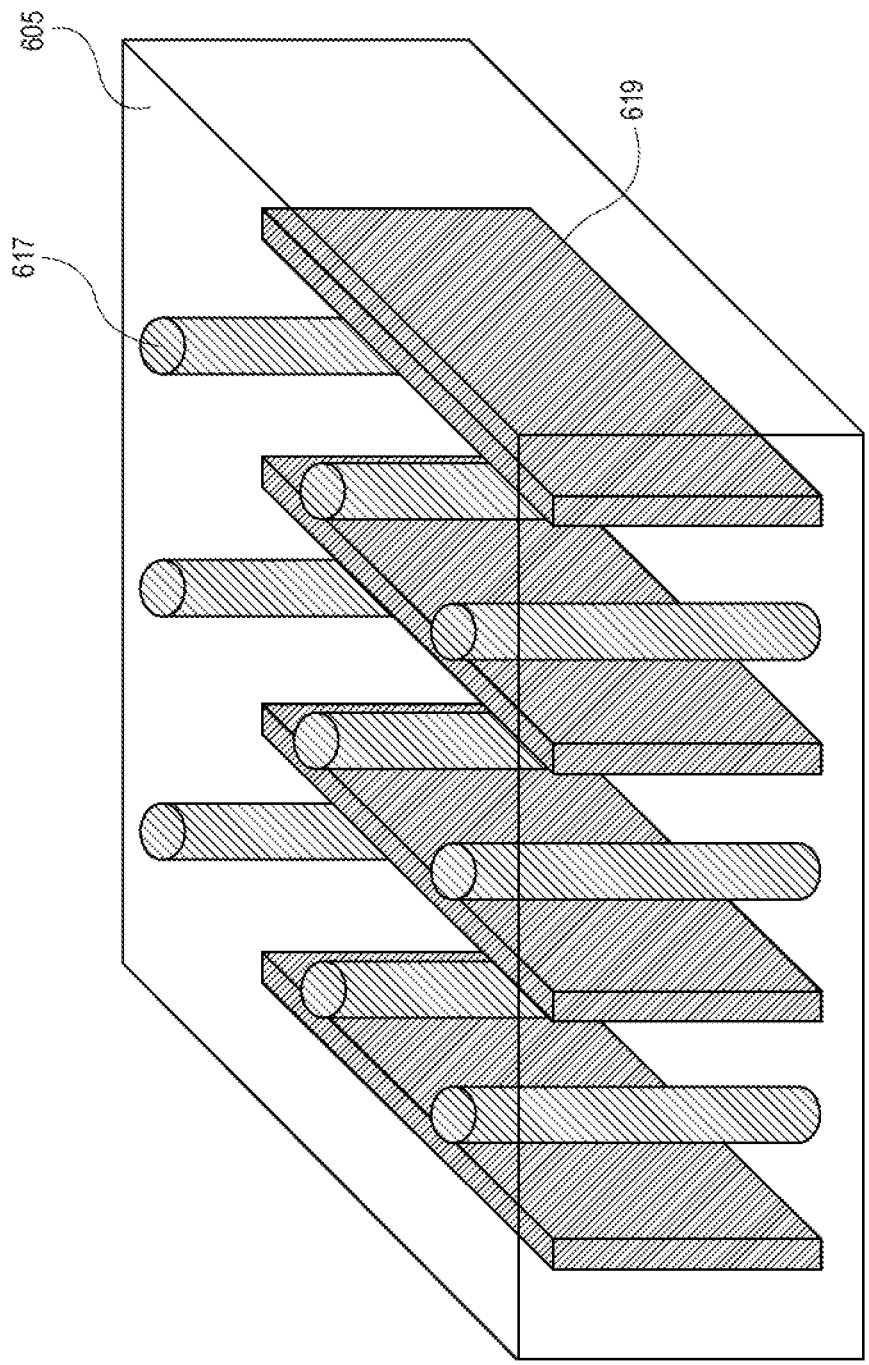
FIG. 6A is a perspective view illustration of a glass core with vias and via planes embedded in the glass core, in accordance with an embodiment.
Figure 6B:
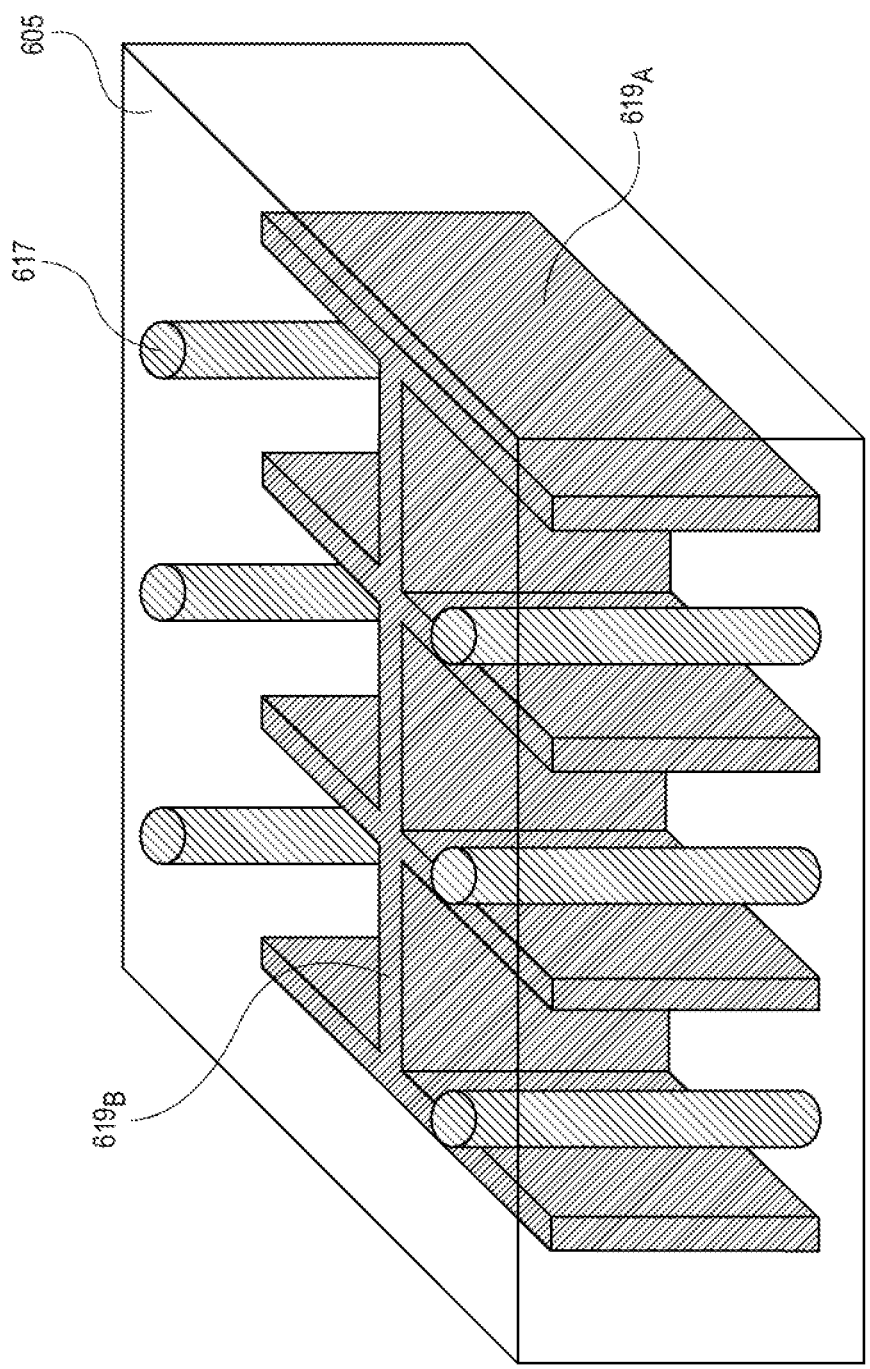
FIG. 6B is a perspective view illustration of a glass core with vias and via planes embedded in the glass core where the via planes intersect each other, in accordance with an embodiment.

Referring now to FIGS. 6A and 6B, perspective view illustrations of a core substrate 605 are shown, in accordance with various embodiments. In FIG. 6A, a plurality of vias 617 and a plurality of via planes 619 are embedded in the core substrate 605. Rows of the vias 617 may be alternated with via planes 619 in some embodiments. Both the vias 617 and the via planes 619 may be fabricated in the core substrate 605 using laser-assisted etching processes, such as those described in greater detail above. Additionally, it is to be appreciated that the via planes 619 and the vias 617 may have different thicknesses through the core substrate 605. For example, the vias 617 may pass entirely through a thickness of the core substrate 605, and the via planes 619 may be blind features. Additionally, while shown as having vertical sidewalls, it is to be appreciated that the vias 617 and via planes 619 may have sloped sidewalls. For example, the vias 617 and via planes 619 may have hourglass shaped cross-sections.

Referring now to FIG. 6B, a perspective view illustration of a core substrate 605 is shown, in accordance with an additional embodiment. The core substrate 605 may be similar to the core substrate 605 in FIG. 6A, with the exception of the via planes 619. Instead of all of the via planes 619 being parallel to each other, one of the via planes 619 intersects the other via planes 619. Particularly, via plane 619E intersects the via planes 619A.

Referring now to FIGS. 7A-7D, cross-sectional illustrations of electronic packages 700 are shown in accordance with additional embodiments. As shown, the electronic packages 700 comprise a package substrate 701. The package substrate 701 comprises a core substrate 705 with vias 717 (or via planes) that are formed with a laser-assisted etching process.

Figure 7A:
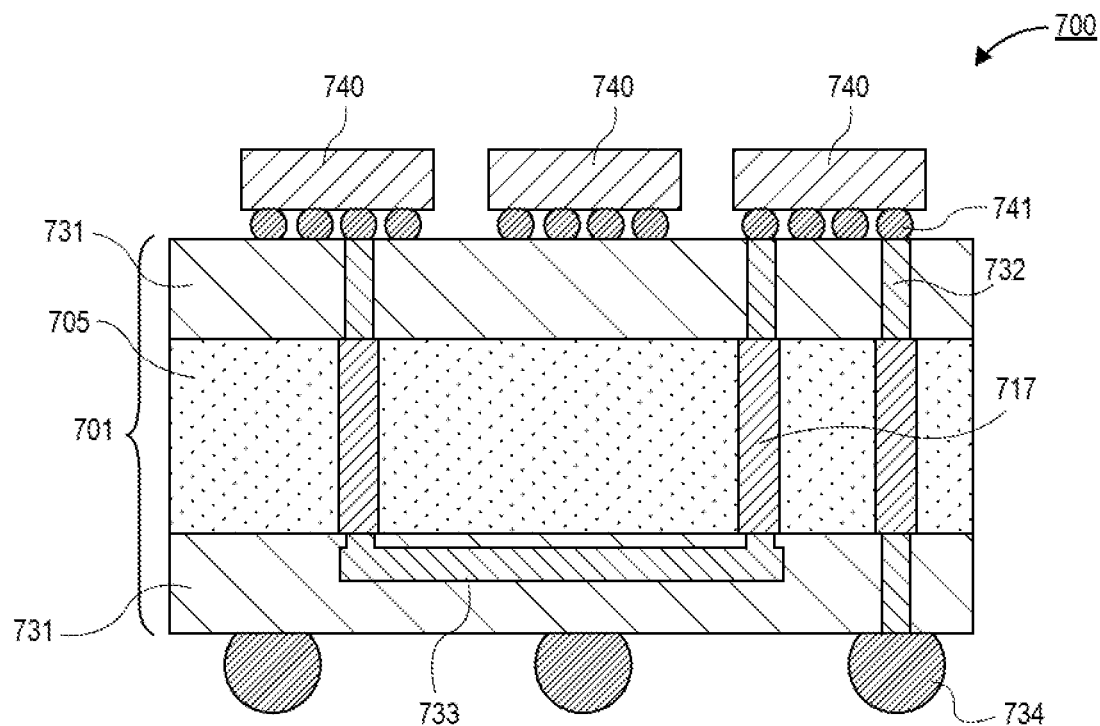
FIG. 7A is a cross-sectional illustration of a package substrate with a glass core with through core vias and buildup layers above and below the glass core, in accordance with an embodiment.

Referring now to FIG. 7A, a cross-sectional illustration of an electronic package 700 with a package substrate 701 that comprises a core substrate 705 with buildup layers 731 above and below the core substrate 705 is shown, in accordance with an embodiment. In an embodiment, the core substrate 705 may be a material that is capable of being morphologically modified by a laser to provide an etch selectivity to the remainder of the core substrate 705. As such, using a laser-assisted etching process, such as those described above, allows for the formation of vias 717 through the core substrate 705. For example, the core substrate 705 may comprise glass, ceramic, silicon, or other nonconductive semiconductors. The vias 717 may be electrically coupled to traces 733, pads, or vias 732 in overlying or underlying buildup layers 731.

In an embodiment, the electronic package 700 may further comprise one or more dies 740. The dies 740 may be electrically coupled to the conductive features in the core substrate 705. For example, solder balls 741 or the like may be used to couple the dies 740 to the package substrate 701. Additionally, solder balls 734, sockets, or the like may be used to couple the package substrate 701 to a board (not shown).

Figure 7B:
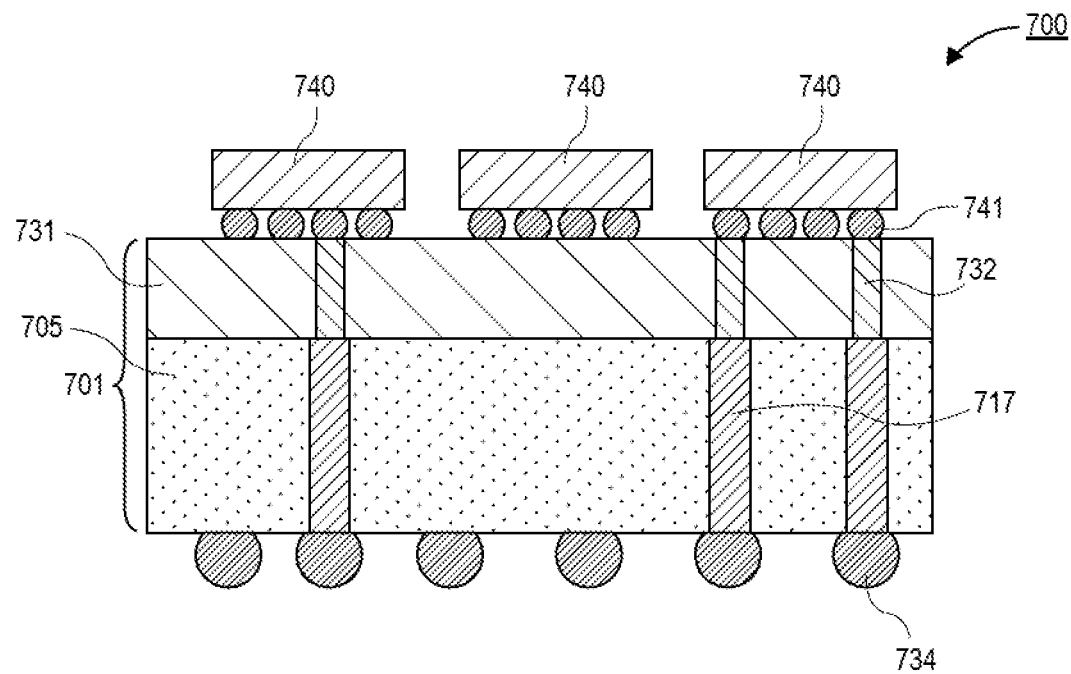
FIG. 7B is a cross-sectional illustration of a package substrate with a glass core with through core vias and a buildup layer above the glass core, in accordance with an embodiment.

Referring now to FIG. 7B, a cross-sectional illustration of an electronic package 700 is shown, in accordance with an additional embodiment. The electronic package 700 in FIG. 7B may be substantially similar to the electronic package 700 in FIG. 7A, with the exception of the lower buildup layer being omitted. As such, the core substrate 705 may be directly coupled to the solder balls 734, sockets, or the like.

Figure 7C:
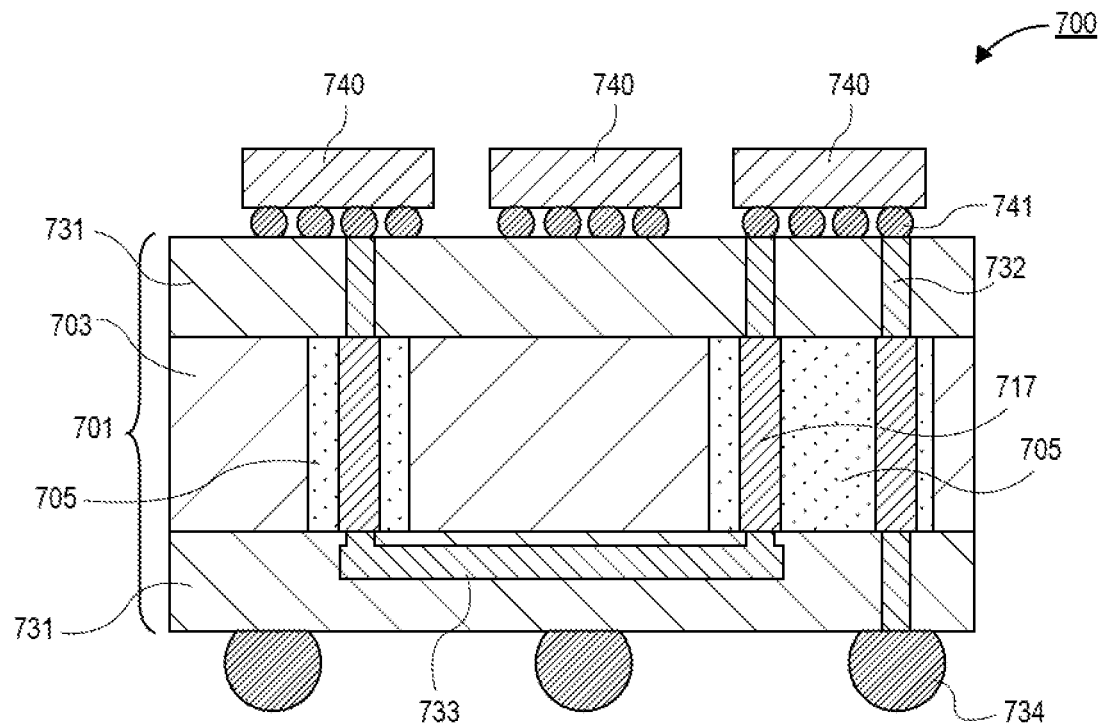
FIG. 7C is a cross-sectional illustration of a package substrate with a core that includes embedded glass core regions and buildup layers above and below the core, in accordance with an embodiment.

Referring now to FIG. 7C, a cross-sectional illustration of an electronic package 700 is shown, in accordance with an additional embodiment. In an embodiment, the electronic package 700 in FIG. 7C may be substantially similar to the electronic package 700 in FIG. 7A, with the exception of the construction of the core substrate 705. Instead of having a single glass layer forming the core substrate, a traditional core layer 703 is provided with patches of the core substrate 705 embedded therein. For example, the traditional core layer 703 may comprise glass-fiber reinforced epoxy or a CCL, and the patches of the core substrate 705 may comprise glass, ceramic, silicon, or other nonconductive semiconductor materials.

Figure 7D:
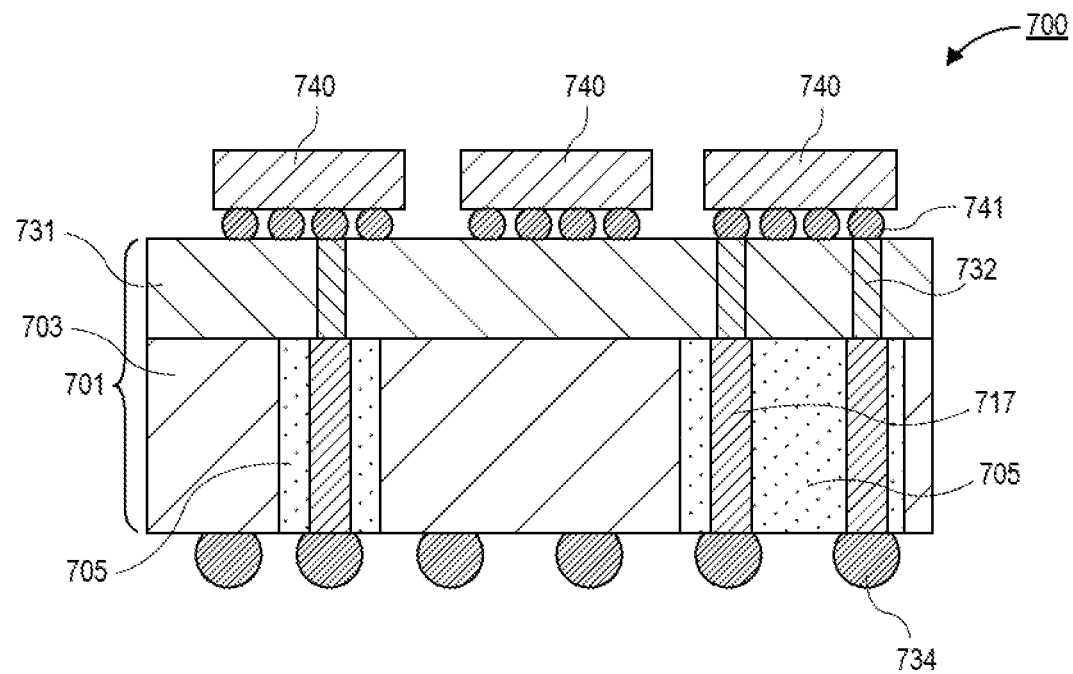
FIG. 7D is a cross-sectional illustration of a package substrate with a core that includes embedded glass core regions and a buildup layer above the core, in accordance with an embodiment.

Referring now to FIG. 7D, a cross-sectional illustration of an electronic package 700 is shown, in accordance with an additional embodiment. In an embodiment, the electronic package 700 in FIG. 7D may be substantially similar to the electronic package 700 in FIG. 7C, with the exception of the bottom buildup layer 731 being removed. Instead, the solder balls 734 may be directly coupled to the traditional core layer 703 and the core substrate 705.

In the embodiments described above, the vias are formed through an entire thickness of the core substrate that comprises a single layer. That is the core substrate has a substantially large thickness. However, extending the thickness of the core substrate results in the need to form high aspect ratio vias. In order to ease the manufacturing complexity, additional embodiments include a plurality of core substrate layers that are adhered together. The vias in each of the core substrate layers have a lower aspect ratio and can be combined to form high aspect ratio features. Examples of such embodiments are shown in FIGS. 8A-8E.

Figure 8A:
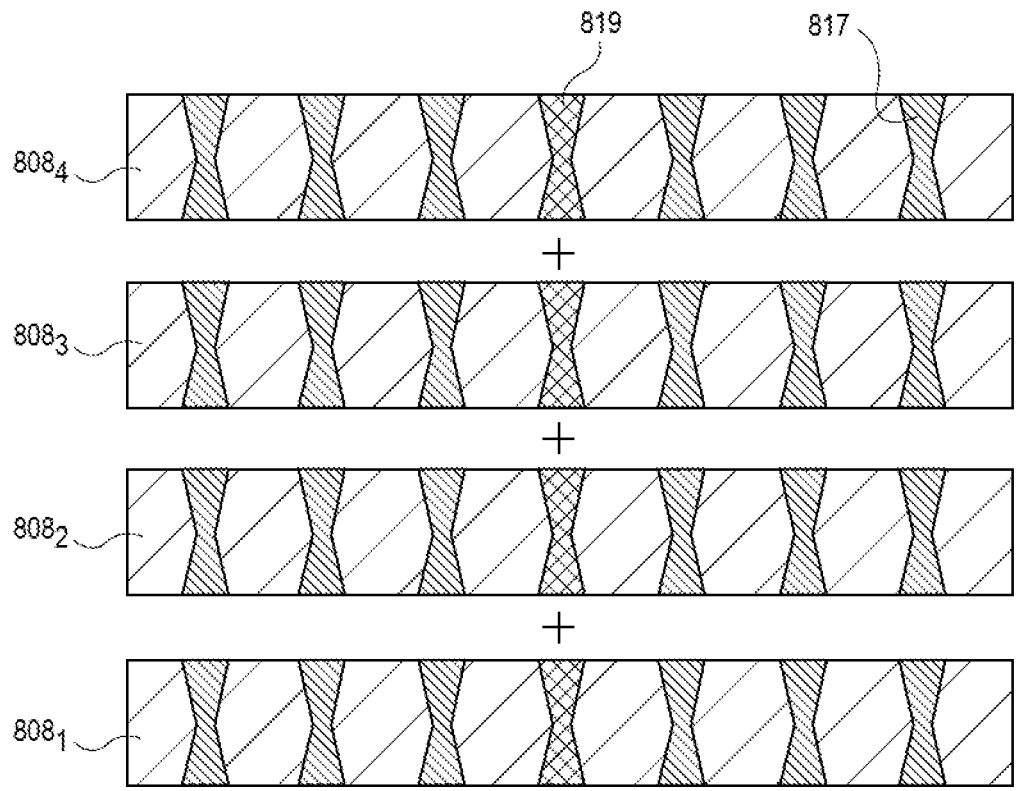
FIG. 8A is a cross-sectional illustration of a plurality of glass layers with each glass layer comprising through layer vias, in accordance with an embodiment.

Referring now to FIG. 8A, a cross-sectional illustration of a plurality of core substrate layers $808_1$-$808_4$ is shown, in accordance with an embodiment. Each core substrate layer 808 may include through layer vias 817 and trenches 819. The trenches 819 may extend into and out of the plane of FIG. 8A in order to form via planes, or the like. Each core substrate layer 808 may have a thickness that is approximately 200 μm or less, approximately 100 μm or less, or approximately 50 μm or less. As such, the aspect ratios of the vias 817 and the trenches 819 are reduced compared to instances where a single thick core substrate is used. While four core substrate layers 808 are shown in FIG. 8A, it is to be appreciated that embodiments may include two or more core substrate layers 808.

The vias 817 and trenches 819 may be fabricated using a laser-assisted etching process, similar to one or more of the processes described in greater detail above. That is, the material for the core substrate layers 808 may be a material that can be morphologically changed as a result of laser exposure. For example, the core substrate layers 808 may comprise glass, ceramics, silicon, or other non-conductive semiconductor materials. The laser assisted etching process may result in sidewalls of the vias 817 and trenches 819 that are sloped. For example, sloped surfaces of the vias 817 and the trenches 819 may have a slope (away from vertical) that is approximately 10° or less. In the illustrated embodiment, the cross-sectional shapes of the vias 817 and the trenches 819 are hourglass shaped.

Figure 8B:
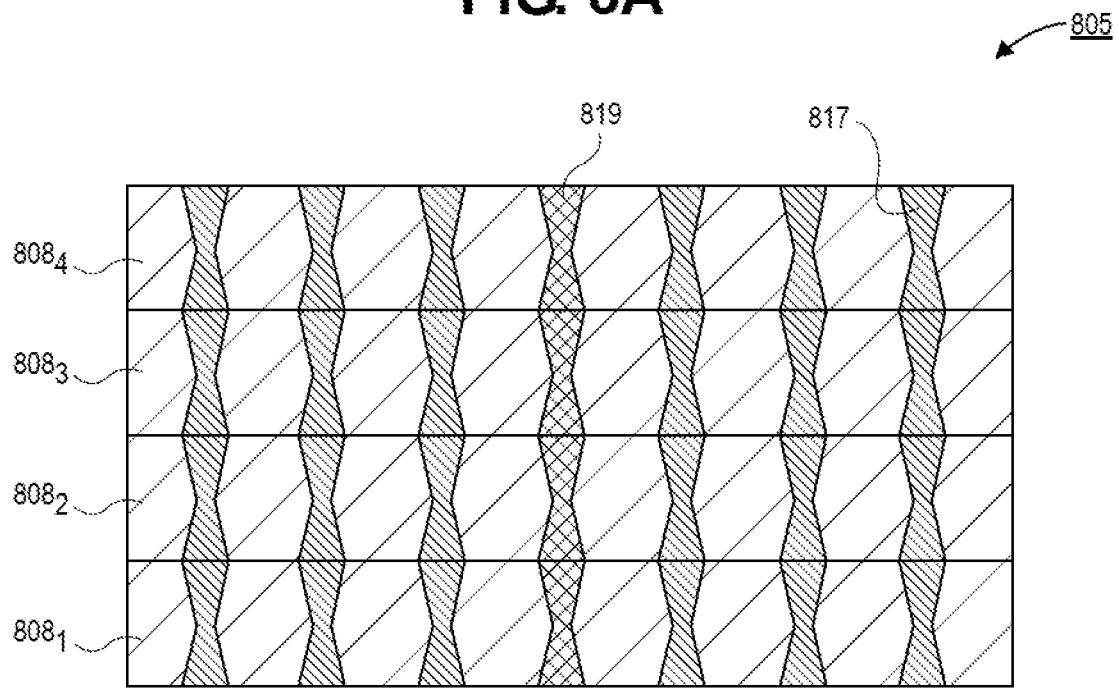
FIG. 8B is a cross-sectional illustration of a glass core that comprises a plurality of glass layers that are adhered together, in accordance with an embodiment.

Referring now to FIG. 8B, a cross-sectional illustration of a core substrate 805 is shown, in accordance with an embodiment. In an embodiment, the core substrate 805 is formed from a plurality of substrate layers $808_1$-$808_4$. The individual core substrate layers 808 may be bonded together with a hybrid bonding process. For example, the interface between layers 808 may include glass-to-glass bonding in addition to metal-to-metal bonding. In such an embodiment, the vias 817 in each layer 808 may be directly coupled to each other with no intervening material. Similarly, the glass of each layer 808 may be directly coupled to each other with no intervening material.

Since the vias 817 and trenches 819 are formed individually in each layer 808, the cross-section of the combined structure is unique. Instead of a single hourglass shaped cross-section, embodiments include a through core via with a cross-section comprising a plurality of repeating hourglass shaped sections. For example, in FIG. 8B, each through core via includes four hourglass shaped sections that are directly stacked on each other.

Figure 8C:
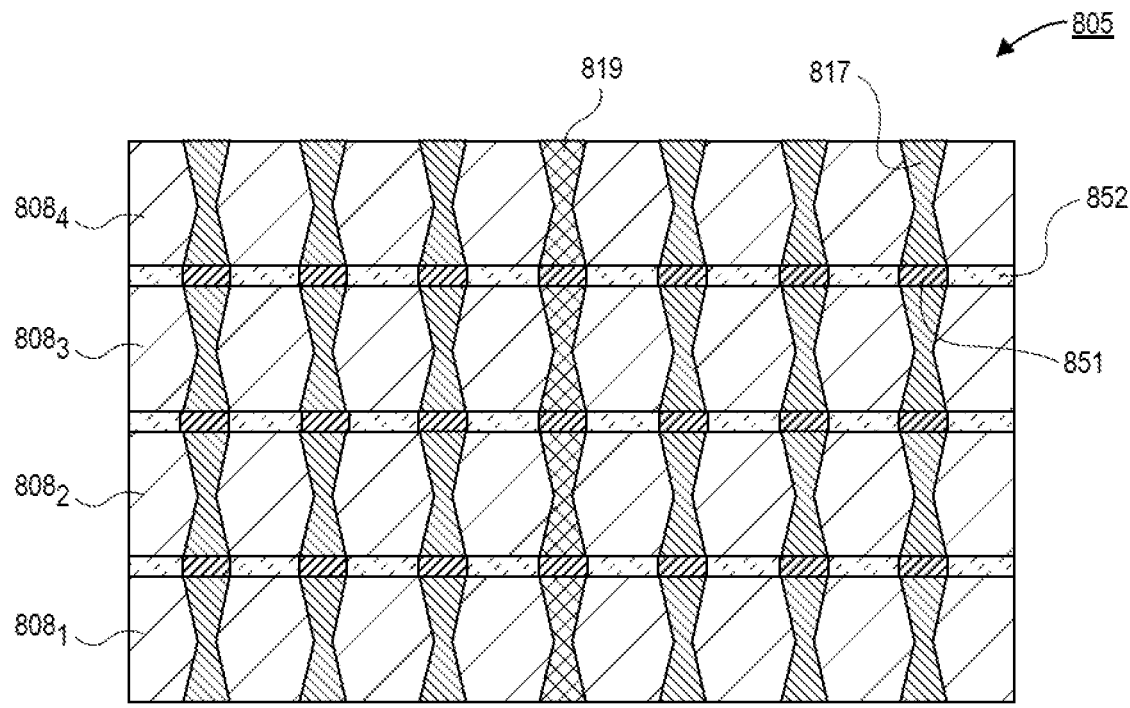
FIG. 8C is a cross-sectional illustration of a glass core that comprises a plurality of glass layers that are separated from each other by an underfill, in accordance with an embodiment.

Referring now to FIG. 8C, a cross-sectional illustration of a core substrate 805 is shown, in accordance with an additional embodiment. The core substrate 805 may be substantially similar to the core substrate 805 in FIG. 8B, with the exception of the bonding between the individual layers 808. Instead of a direct hybrid bonding, a bonding layer is provided between each layer 808. In an embodiment, the bonding layer comprises a plurality of interconnects 851. The interconnects 851 may be solder balls, copper pillars, or the like. The interconnects 851 provide electrical coupling between the vias 817 and trenches 819 of different layers 808. In the illustrated embodiment, an interconnect 851 is provided between all vias 817 and trenches 819. However, it is to be appreciated that the interface between some vias 817 and some trenches 819 may omit an interconnect 851. In an embodiment, the interconnects 851 may be surrounded by an underfill material 852. The underfill material 852 may also provide an adhesive force to mechanically couple the layers 808 together.

Figure 8D:
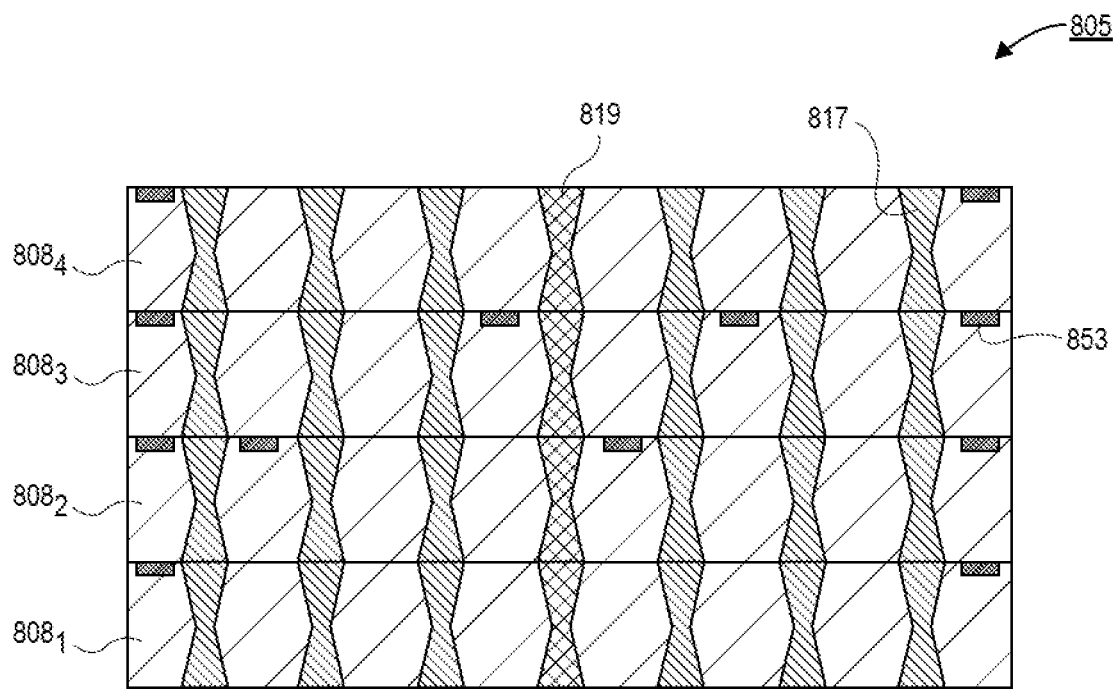
FIG. 8D is a cross-sectional illustration of a glass core that comprises a plurality of glass layers with vertical vias and horizontal traces, in accordance with an embodiment.

Referring now to FIG. 8D, a cross-sectional illustration of a core substrate 805 is shown, in accordance with an additional embodiment. The core substrate 805 in FIG. 8D may be substantially similar to the core substrate 805 in FIG. 8B, with the exception of the addition of lateral routing traces 853 included in the layers 808. The traces 853 may provide signal routing and/or power delivery. The traces 853 may also be formed with laser-assisted etching processes. For example, the processing used to form blind features described above may also be used to form traces 853 that are embedded in the surfaces of the layers 808.

Figure 8E:
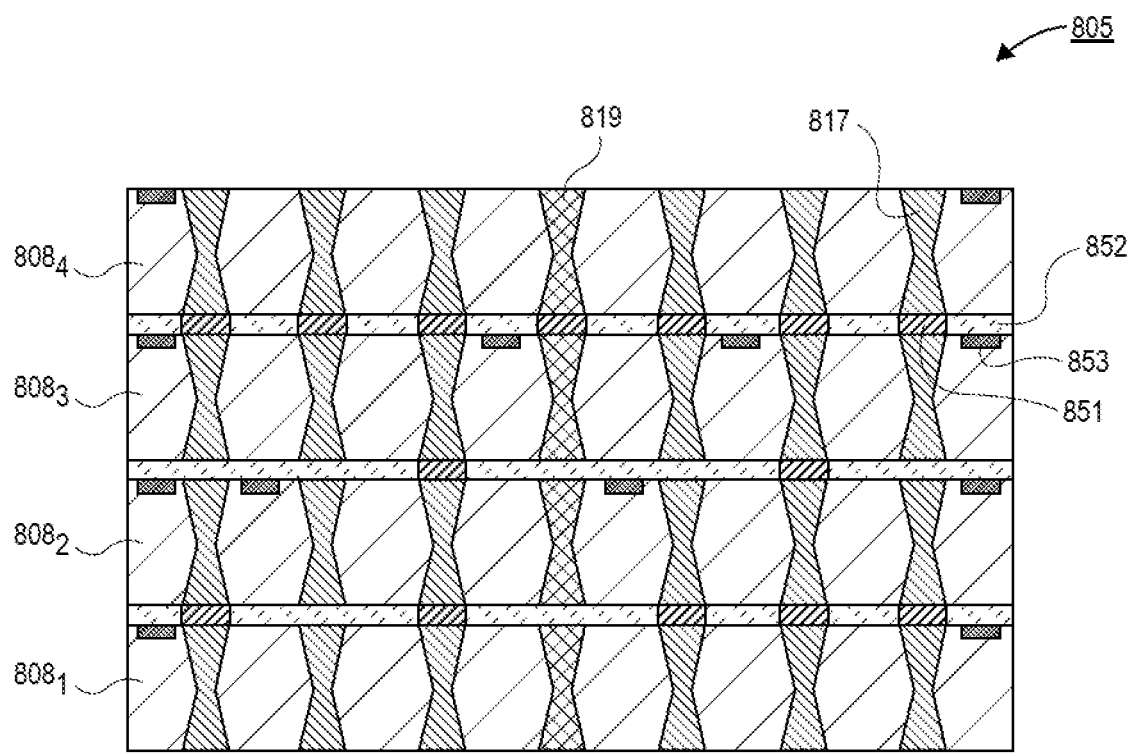
FIG. 8E is a cross-sectional illustration of a glass core that comprises a plurality of glass layers separated from each other by an underfill and with vertical vias and horizontal traces, in accordance with an embodiment.

Referring now to FIG. 8E, a cross-sectional illustration of a core substrate 805 is shown, in accordance with an additional embodiment. The core substrate 805 in FIG. 8E may be substantially similar to the core substrate 805 in FIG. 8C, with the exception of the addition of lateral routing traces 853 included in the layers 808. Additionally, FIG. 8E shows that not all vias 817 and trenches 819 need to be connected to each other by an interconnect 851.

Figure 9:
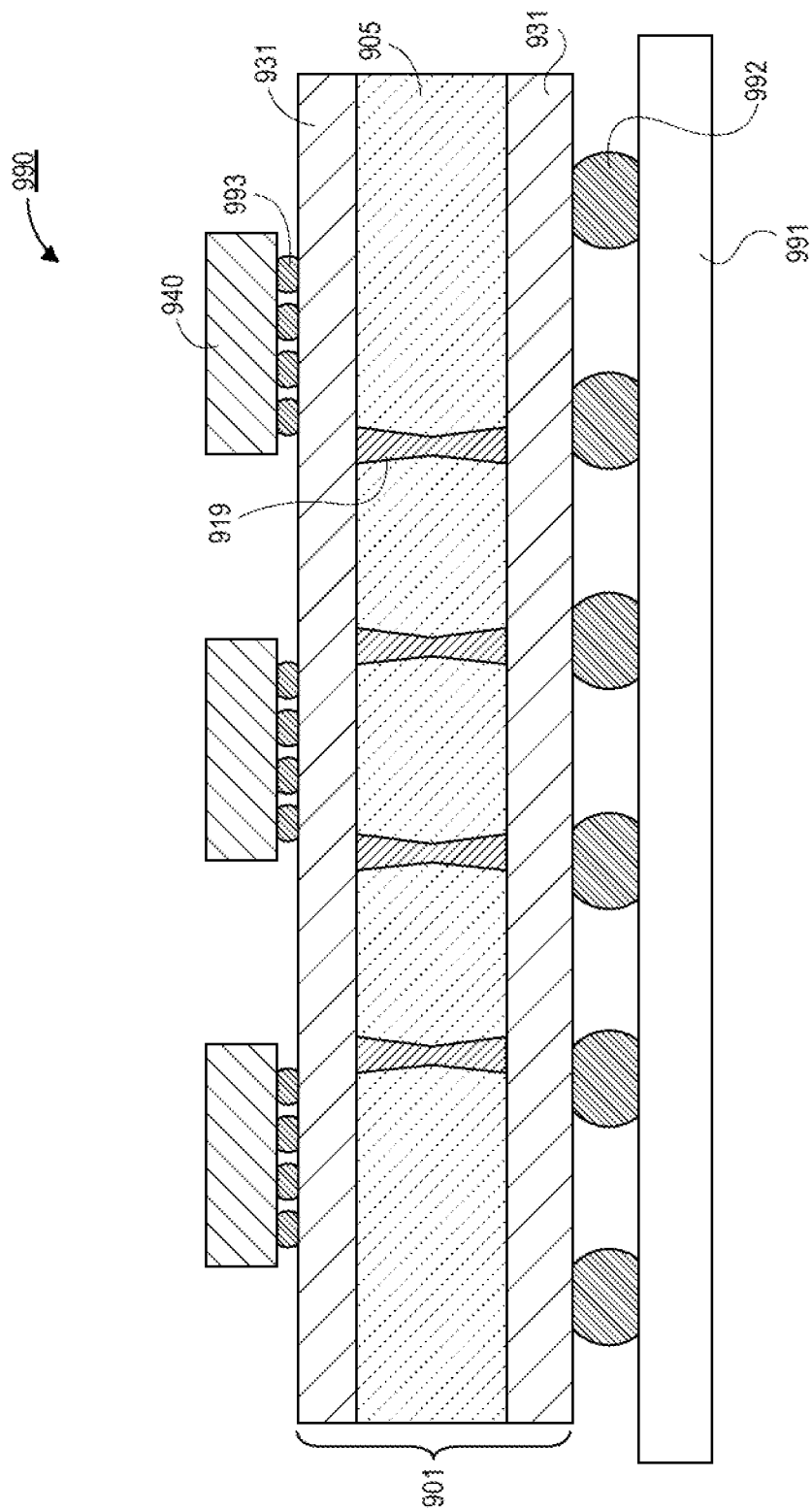
FIG. 9 is a cross-sectional illustration of an electronic system that comprises a package substrate with a core substrate that is patterned with a laser-assisted patterning process, in accordance with an embodiment.

Referring now to FIG. 9, a cross-sectional illustration of an electronic package 990 is shown, in accordance with an embodiment. In an embodiment, the electronic package 990 comprises a board 991, such as a printed circuit board (PCB). The board 991 is coupled to a package substrate 901 by interconnects 992. The interconnects 992 may comprise solder balls, sockets, or any other suitable interconnect architecture.

The package substrate 901 comprises a core substrate 905. The core substrate 905 is a material that can be patterned with a laser-assisted patterning process. For example, vias 919, trenches, or the like may be formed by exposing the core substrate 905 to a laser, etching the exposed region, and depositing a material in the resulting hole, similar to embodiments described in greater detail above. The core substrate 905 may comprise glass, ceramic, silicon, or other nonconductive semiconductors. In an embodiment, the core substrate 905 is a monolithic structure, similar to the embodiments described in FIGS. 1A-7D above. In other embodiments, the core substrate 905 is comprised of a plurality of stacked layers (e.g., a plurality of glass layers), similar to the embodiments described in FIGS. 8A-8E above.

In an embodiment, the package substrate 901 may also comprise one or more buildup layers 931. The buildup layers 931 may be above and/or below the core substrate 905. The buildup layers 931 may be connected to one or more dies 940 by first level interconnects 993. The first level interconnects 993 may be solder balls, copper bumps, or the like. The dies 940 may be any sort of die, such as a compute die, a graphics die, a memory die, or the like.

Figure 10:
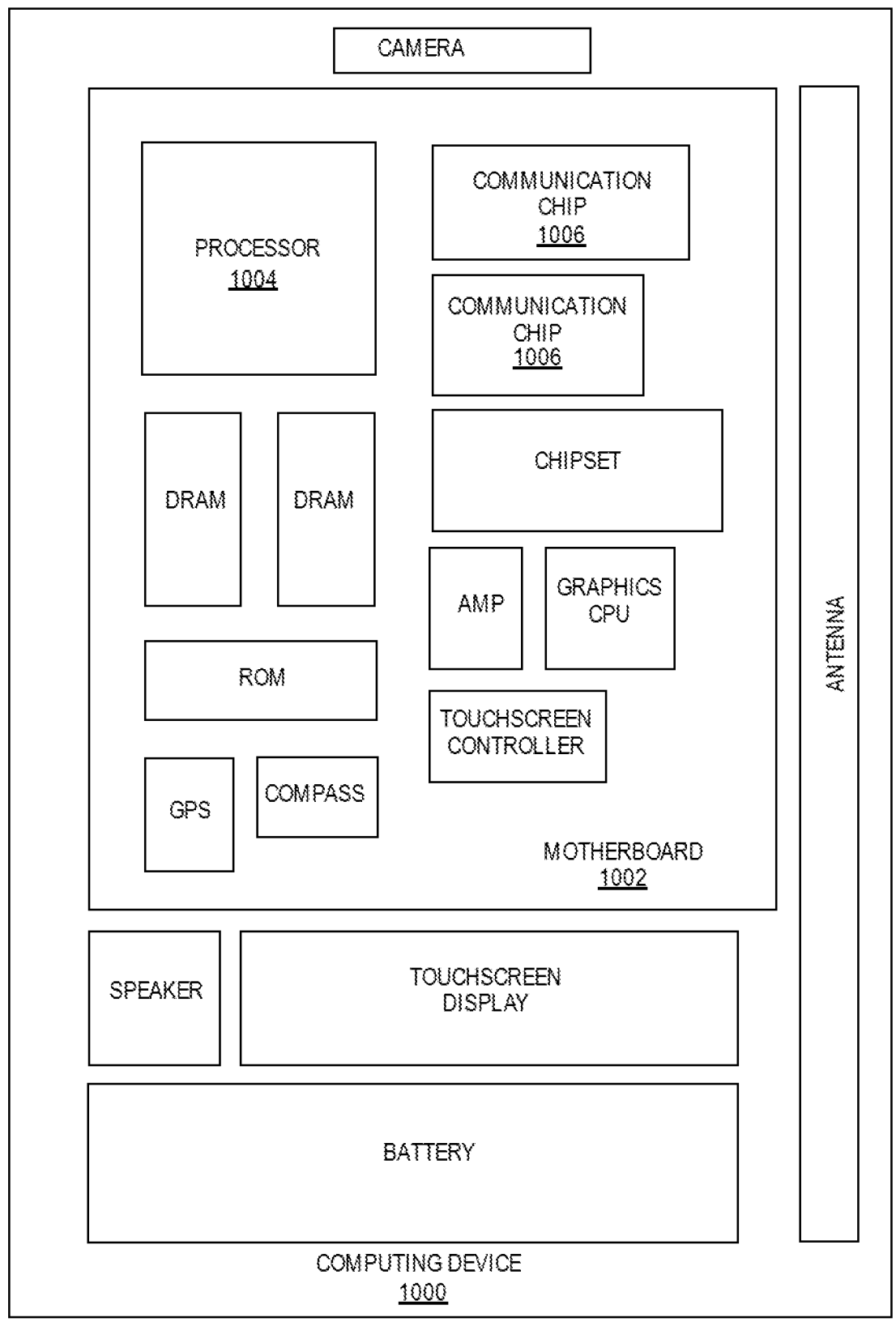
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be part of an electronic package that comprises a package substrate with a core that is patterned with a laser-assisted etching process, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be part of an electronic package that comprises a package substrate with a core that is patterned with a laser-assisted etching process, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a first glass layer, wherein the first glass layer comprises a first via through the first glass layer, and wherein the first via has an hourglass shaped cross-section; and a second glass layer over the first glass layer, wherein the second glass layer comprises a second via through the second glass layer, wherein the second via has the hourglass shaped cross-section, and wherein the first via is electrically coupled to the second via.

Example 2: the package substrate of Example 1, wherein the first via directly contacts the second via.

Example 3: the package substrate of Example 2, wherein the first glass layer directly contacts the second glass layer.

Example 4: the package substrate of Examples 1-3, wherein the first via is electrically coupled to the second via by an interconnect between the first via and the second via.

Example 5: the package substrate of Example 4, wherein an underfill is provided between the first glass layer and the second glass layer.

Example 6: the package substrate of Examples 1-5, wherein the first via and the second via are via planes.

Example 7: the package substrate of Example 1-6, wherein the first glass layer and the second glass layer each have a first thickness that is approximately 100 µm or less.

Example 8: the package substrate of Example 7, wherein the first via and the second via each have a diameter that is approximately 50 µm or less.

Example 9: the package substrate of Examples 1-8, wherein the hourglass shaped cross-section has sidewalls that are angled at 10° or less from a vertical orientation.

Example 10: the package substrate of Examples 1-9, wherein the first glass layer and the second glass layer are photo-definable glass materials.

Example 11: the package substrate of Examples 1-10, further comprising: a trace embedded in the first glass layer.

Example 12: the package substrate of Examples 1-11, further comprising: a plurality of glass layers in addition to the first glass layer and the second glass layer, and a plurality of vias through the plurality of glass layers.

Example 13: the method of forming a package substrate, comprising: forming first vias through a first glass layer, wherein the first vias are formed by exposing the first glass layer to a laser, etching exposed portions of the first glass layer to form holes, and depositing a via material in the holes; forming second vias through a second glass layer, wherein the second vias are formed by exposing the second glass layer to the laser, etching exposed portions of the second glass layer to form holes, and depositing a via material in the holes; and securing the first glass layer to the second glass layer, wherein the first vias are electrically coupled to the second vias.

Example 14: the method of Example 13, wherein the first vias and the second vias comprise an hourglass shaped cross-section.

Example 15: the method of Example 13 or Example 14, wherein the first glass layer directly contacts the second glass layer.

Example 16: the method of Examples 13-15, wherein the first vias are electrically coupled to the second vias by interconnects.

Example 17: an electronic system, comprising: a board; a package substrate coupled to the board, wherein the package substrate comprises: a core substrate with a plurality of glass layers and a plurality of vias through the plurality of glass layers; and a buildup layer over the core substrate; and a die coupled to the package substrate.

Example 18: the electronic system of Example 17, wherein the plurality of vias each have an hourglass shaped cross-section.

Example 19: the electronic system of Example 17 or Example 18, wherein the plurality of glass layers are in direct contact with each other.

Example 20: the electronic system of Examples 17-19, wherein an underfill is provided between each of the plurality of glass layers.

What is claimed is:

1. A package substrate, comprising:
    a first glass layer, wherein the first glass layer comprises a first via through the first glass layer, and wherein the first via has a first hourglass shaped cross-section; and
    a second glass layer over and in direct contact with the first glass layer, wherein the second glass layer comprises a second via through the second glass layer, wherein the second via has a second hourglass shaped cross-section, wherein the first via is electrically coupled to the second via, wherein a widest portion of the second via is in direct physical contact with a widest portion of the first via, wherein the widest portion of the second via has a bottommost surface at a same level as a bottommost surface of the second glass layer, and wherein the first via has an uppermost surface at a same level as an uppermost surface of the first glass layer.

2. The package substrate of claim 1, wherein the first via and the second via are via planes.

3. The package substrate of claim 1, wherein the first glass layer and the second glass layer each have a first thickness that is approximately 100 μm or less.

4. The package substrate of claim 3, wherein the first via and the second via each have a diameter that is approximately 50 μm or less.

5. The package substrate of claim 1, wherein the first or second hourglass shaped cross-section has sidewalls that are angled at 10° or less from a vertical orientation.

6. The package substrate of claim 1, wherein the first glass layer and the second glass layer are photo-definable glass materials.

7. The package substrate of claim 1, further comprising: a trace embedded in the first glass layer.

8. The package substrate of claim 1, further comprising: a plurality of glass layers in addition to the first glass layer and the second glass layer, and a plurality of vias through the plurality of glass layers.

9. A method of forming a package substrate, comprising:
    forming first vias through a first glass layer, wherein the first vias are formed by exposing the first glass layer to a laser, etching exposed portions of the first glass layer to form holes, and depositing a via material in the holes;
    forming second vias through a second glass layer, wherein the second vias are formed by exposing the second glass layer to the laser, etching exposed portions of the second glass layer to form holes, and depositing a via material in the holes; and
    securing the first glass layer to the second glass layer such that the first glass layer is in direct contact with the second glass layer, wherein the first vias are electrically coupled to the second vias, wherein the first vias and the second vias comprise an hourglass shaped cross-section, wherein a widest portion of each of the second vias is in direct physical contact with a widest portion of a corresponding one of the first vias, wherein the widest portion of each of the second vias has a bottommost surface at a same level as a bottommost surface of the second glass layer, and wherein each of the first vias has an uppermost surface at a same level as an uppermost surface of the first glass layer.

10. The method of claim 9, wherein the first vias are electrically coupled to the second vias by interconnects.

11. An electronic system, comprising:
    a board;
    a package substrate coupled to the board, wherein the package substrate comprises:
        a core substrate with a plurality of glass layers and a plurality of vias through the plurality of glass layers, wherein the plurality of glass layers are in direct contact with each other, wherein the plurality of vias each have an hourglass shaped cross-section, wherein a widest portion of each of the vias of a first glass layer of the plurality of glass layers is in direct physical contact with a widest portion of a corresponding one of the vias of a second glass layer of the plurality of glass layers, wherein the widest portion of each of the vias of the second glass layer has a bottommost surface at a same level as a bottommost surface of the second glass layer, and wherein each of the vias of the first glass layer has an uppermost surface at a same level as an uppermost surface of the first glass layer; and
        a buildup layer over the core substrate; and
    a die coupled to the package substrate.

12. The electronic system of claim 11, wherein an underfill is provided between each of the plurality of glass layers.

* * * * *